US009234787B2

(12) United States Patent
Nagai (10) Patent No.: US 9,234,787 B2
(45) Date of Patent: Jan. 12, 2016

(54) ACTUATOR MOUNT FOR A COMBINATION WEIGHER (75) Inventor: Takayuki Nagai, Hyogo (JP)

(73) Assignee: YAMATO SCALE CO., LTD., Akashi-shi, Hyogo (JP)

( * ) Notice: Subject to any disclaimer, the term of this patent is extended or adjusted under 35 U.S.C. 154(b) by 264 days.

(21) Appl. No.: 13/881,367

(22) PCT Filed: Oct. 29, 2010

(86) PCT No.: PCT/JP2010/006413
§ 371 (c)(1),
(2), (4) Date: Jul. 15, 2013

(87) PCT Pub. No.: WO2012/056502
PCT Pub. Date: May 3, 2012

(65) Prior Publication Data
US 2013/0284521 A1 Oct. 31, 2013

(51) Int. Cl.
G01G 19/387 (2006.01)
G01G 21/28 (2006.01)
G01G 19/393 (2006.01)

(52) U.S. Cl.
CPC ............ *G01G 19/387* (2013.01); *G01G 19/393* (2013.01); *G01G 21/28* (2013.01)

(58) Field of Classification Search
CPC ... G01G 19/387; G01G 19/393; G01G 21/28; G01G 21/283
See application file for complete search history.

(56) References Cited

U.S. PATENT DOCUMENTS

| 2,566,064 | A | * | 8/1951 | Keim | 361/724 |
| 2,691,724 | A | * | 10/1954 | Hoffman | 455/176.1 |
| 3,708,618 | A | * | 1/1973 | Hofmeister et al. | 348/839 |
| 4,582,151 | A | * | 4/1986 | Mairot et al. | 177/144 |
| 5,038,875 | A | * | 8/1991 | Kitagawa et al. | 177/25.18 |
| 5,562,410 | A | * | 10/1996 | Sachs et al. | 415/213.1 |
| 5,842,030 | A | * | 11/1998 | Larabell et al. | 713/340 |
| 6,050,658 | A | * | 4/2000 | O'Sullivan et al. | 312/223.1 |
| 6,169,661 | B1 | * | 1/2001 | Lee | 361/752 |
| 6,188,029 | B1 | * | 2/2001 | Miyamoto et al. | 177/105 |
| 6,535,390 | B1 | * | 3/2003 | Lo | 361/726 |
| 6,566,613 | B1 | * | 5/2003 | Gesuita et al. | 177/25.18 |
| 6,674,021 | B2 | * | 1/2004 | Tanaka et al. | 177/25.18 |
| 6,703,568 | B2 | * | 3/2004 | Wako et al. | 177/25.18 |
| 8,716,611 | B2 | * | 5/2014 | Schon | 177/238 |
| 2009/0200087 | A1 | | 8/2009 | Higuchi et al. | |

FOREIGN PATENT DOCUMENTS

CN 01175976 A 5/2008
EP 1197734 A1 4/2002
(Continued)

OTHER PUBLICATIONS

Extended European Search Report from Application No. EP 10 85 8894 dated Feb. 6, 2015.

(Continued)

*Primary Examiner* — Randy W Gibson
(74) *Attorney, Agent, or Firm* — Marshall, Gerstein & Borun LLP (57) ABSTRACT A combination weigher (100) comprises actuator units (19) for actuating weighing hoppers (14), and a body (17) having a side wall (17C) attached with the actuator units (19), and a casing member used to accommodate feeders (12) is formed by the side wall (17C).

1 Claim, 3 Drawing Sheets

(56) References Cited

FOREIGN PATENT DOCUMENTS

| JP | 2-27525 | | 2/1990 | |
| JP | 10-019648 | | 1/1998 | |
| JP | 2001-272267 | A | 10/2001 | |
| JP | 3670295 | B2 | 7/2005 | |
| JP | 2009-244130 | A * | 10/2009 | ........... G01G 19/387 |
| JP | 2011-080939 | A * | 4/2011 | ........... G01G 19/387 |
| JP | 20012-237643 | A * | 12/2012 | ........... G01G 19/387 |
| WO | WO-98/01727 | A1 | 1/1998 | |

OTHER PUBLICATIONS

International Search Report for PCT/JP2010/006413, mailed Nov. 22, 2010.

* cited by examiner

ACTUATOR MOUNT FOR A COMBINATION WEIGHER

The present invention relates to a combination weigher. Particularly, the present invention relates to improvement of sanitary conditions of a combination weigher used for weighing objects.

BACKGROUND ART

Conventionally, a combination weigher is used to combine objects (e.g., food such as snacks) which are non-uniform in weights to efficiently attain a target weight.

This combination weigher typically includes a dispersion feeder which is capable of dispersing and supplying objects evenly to components around the dispersion feeder, a plurality of linear feeders arranged at equal intervals around the dispersion feeder, feeding hoppers arranged so as to correspond to the linear feeders, respectively, and weighing hoppers arranged so as to correspond to the linear feeders, respectively.

In the above configuration, the objects are sent from the dispersion feeder to linear troughs of the linear feeders, and the objects of a suitable amount are transported by vibration on the linear troughs by vibration components of the linear feeders and fed to the weighing hoppers coupled to load cells through the feeding hoppers, respectively. The load cells detect weights of the objects inside of the weighing hoppers, respectively. Based on a combination of weight values of the weighing hoppers, the weighing hoppers making up an optimal combination in which the weight of the objects falls within a target weight of the objects, are selected. Then, the objects are discharged from the weighing hoppers selected to make up the combination collectively onto a collecting chute located therebelow. A packaging machine packages the collective objects.

The above stated combination weigher is typically used to weigh food as the objects. Therefore, the combination weigher preferably has a sanitary structure. Because of this, components such as the linear troughs, the feeding hoppers, and the weighing hoppers, which the objects directly contact, are formed of, for example, stainless plates. The linear feeders and actuators (motors for opening and closing gates, etc.) are accommodated into, for example, stainless-made cases. This makes it possible to improve a waterproofing property of the linear feeders and the actuators, and suppress entry of foreign matters (wastes of the objects, dust) into the linear feeders and the actuators.

A combination weigher in which the linear feeders and the actuators are accommodated into the cases is shown in FIG. 1 of Patent Literature 1.

CITATION LISTS

Patent Literature

Patent Literature 1: Japanese Patent No. 3670295 (FIG. 1)

SUMMARY OF INVENTION

Technical Problem

However, there are many points to be improved for ensuring improved sanitary conditions in the combination weigher disclosed in Patent Literature 1.

Firstly, since an upper case 41 of a hopper unit 40 protrudes laterally from a body, foreign matters (e.g., wastes of the objects and dust) tend to be accumulated on an upper surface of the upper case 41.

Secondarily, a case (hereinafter sometimes referred to as "feeder case") accommodating the linear feeder is separate from a case (hereinafter sometimes referred to as "unit case") supporting the hopper unit 40. Therefore, a gap (clearance) tends to be generated between the cases. This causes a need for special measures for ensuring a proper waterproofing property in a joint section at which these cases are joined together and preventing the foreign matters from entering the joint section.

Thirdly, there exists a stepped portion between the feeder case and the unit case. Because of the stepped portion, sanitary conditions of the combination weigher degrade and cleaning is not carried out easily.

As should be appreciated from above, it is essential that the structure of the combination weigher disclosed in Patent Literature 1 need to be drastically overhauled, to ensure the improved sanitary conditions of the combination weigher.

The present invention has been developed under the circumstances, and an object of the present invention is to provide a combination weigher which can improve sanitary conditions as compared to the conventional example.

Solution to Problem

Mounting states of the units (linear feeder, feeding hopper, weighing hopper, body, etc.) of the combination weigher are determined as particular positions based on relative positions of the linear trough of the linear feeder and the feeding hopper, when the objects are dropped from the linear trough of the linear feeder to the feeding hopper, and a center-of-gravity of the linear feeder when the linear trough is vibrated by the linear feeder.

From this, the inventors found out that the feeder case and the body can be constructed as a unitary structure by optimally designing a shape of the body of the combination weigher, and hence the sanitary conditions of the combination weigher can be improved significantly.

To solve the above described problem, the present invention has been conceived based on the above described findings.

According to the present invention, there is provided a combination weigher which causes a plurality of feeders to feed objects to weighing hoppers respectively corresponding to the feeders, performs combination calculation based on weights of the objects inside of the weighing hoppers, to find a combination in which a total of the weights of the objects falls within an allowable range with respect to a target weight, the combination weigher comprising: actuator units for actuating the weighing hoppers; and a body having a side wall attached with the actuator units; wherein a casing member used to accommodate the feeders is formed by the side wall.

In accordance with this configuration, the combination weigher of the present invention can improve sanitary conditions as compared to the conventional example. That is, in the combination weigher of the present invention, the feeder accommodating room and the body attached with the actuator units are formed by the side wall (the feeder accommodating room and the body share the side wall). Therefore, no gap and no stepped portion exist in the body of the combination weigher. Thus, the combination weigher of the present invention has great advantages that sanitary conditions are improved and cleaning is performed easily.

In the combination weigher, the body may include a feeder accommodating room for accommodating the feeders and a unit accommodating room for accommodating the actuator units; and wherein the feeder accommodating room and the unit accommodating room may share the side wall.

In this configuration, no gap and no stepped portion exist between the feeder accommodating room and the unit accommodating room. Therefore, the combination weigher of the present embodiment has great advantages that sanitary conditions are improved and cleaning is performed easily. In addition, since the components of the feeder accommodating room can be reduced in number, cost of the combination weigher can be reduced.

In the combination weigher of the present invention, the feeder accommodating room may be formed by an upper wall covering an interior of the body from above and the side wall.

In this configuration, for example, in a case where all of the vibration components of the feeders are required to be inspected or changed, all of the vibration components of the feeders are easily accessible by detaching the upper wall serving as a lid of the feeder accommodating room. Thus, maintenance of the vibration components of the feeders can be carried out easily. In another case where a few (e.g., one or two) of the vibration component(s) of the feeder(s) is/are required to be inspected or changed, the vibration component(s) of the feeder(s) is/are accessible through, for example, an opening provided on the side wall to access the vibration component(s) of the feeder(s), without detaching the upper wall serving as the lid of the feeder accommodating room. Thus, maintenance of the vibration component(s) of the linear feeder(s) can be carried out more easily.

In the combination weigher of the present invention, the side wall may have an inverted truncated pyramid shape; a mounting section of the actuator unit may extend along the side wall; and a front portion of the actuator unit may be connected to the mounting section outside of the body such that an acute angle is formed between the front portion of the actuator unit and the mounting section.

For example, the front portion may extend vertically downward from a connecting section at which the front portion is connected to the mounting section.

In this configuration, the connecting section at which the front portion of the actuator unit is connected to the mounting section is linear, and therefore there is no upper surface on which wastes of the objects and dust tend to be accumulated easily. Therefore, the combination weigher of the present invention has great advantages that sanitary conditions are improved and cleaning is performed easily.

To achieve the above described object, according to the present invention, there is provided a combination weigher which causes a plurality of feeders to feed objects to weighing hoppers respectively corresponding to the feeders, performs combination calculation based on weights of the objects inside of the weighing hoppers, to find a combination in which a total of the weights of the objects falls within an allowable range with respect to a target weight, the combination weigher comprising: actuator units for actuating the weighing hoppers; and a body having a side wall attached with the actuator units; wherein the side wall has an inverted truncated pyramid shape; wherein a mounting section of the actuator unit extends along the side wall; and wherein a front portion of the actuator unit extends vertically downward from a connecting section at which the front portion of the actuator unit is connected to the mounting section outside of the body such that an acute angle is formed between the front portion of the actuator unit and the mounting section.

In accordance with this configuration, the combination weigher of the present invention improve sanitary conditions as compared to the conventional example. That is, the connecting section at which the front portion of the actuator unit is connected to the mounting section is linear, and therefore there is no upper surface on which wastes of the objects and dust tend to be accumulated easily. Therefore, the combination weigher of the present embodiment has great advantages that sanitary conditions are improved and cleaning is performed easily.

Advantageous Effects of the Invention

In accordance with the present invention, it is possible to provide a combination weigher which can improve sanitary conditions as compared to the conventional example.

The above and further objects, features and advantages of the present invention will more fully be apparent from the following detailed description of preferred embodiments with accompanying drawings.

DESCRIPTION OF THE EMBODIMENTS (Embodiment)

First of all, the feature of the embodiment of the present invention will be described.

According to Embodiment 1, there is provided a combination weigher which causes a plurality of feeders to feed objects to weighing hoppers corresponding to the feeders, respectively, and performs combination calculation based on weights of the objects inside of the weighing hoppers, to find a combination in which a total of the weights of the objects falls within an allowable range with respect to a target weight, the combination weigher comprising: actuator units for actuating the weighing hoppers; and a body having a side wall attached with the actuator units; wherein a casing member used to accommodate the feeders is formed by the side wall.

According to Embodiment 2, there is provided a combination weigher which causes a plurality of feeders to feed objects to weighing hoppers corresponding to the feeders, respectively, and performs combination calculation based on weights of the objects inside of the weighing hoppers, to find a combination in which a total of the weights of the objects falls within an allowable range with respect to a target weight, the combination weigher comprising: actuator units for actuating the weighing hoppers; and a body having a side wall attached with the actuator units; wherein the side wall has an inverted truncated pyramid shape; wherein a mounting section of the actuator unit extends along the side wall; and wherein a front portion of the actuator unit extends vertically downward from a connecting section at which the front portion of the actuator unit is connected to the mounting section outside of the body such that an acute angle is formed between the front portion of the actuator unit and the mounting section.

As described above, with the above described configuration, in the combination weigher of Embodiment 1 and the combination weigher of Embodiment 2 are able to improve sanitary conditions as compared to the conventional example.

Next, specific examples of the configuration of the combination weigher according to Embodiment 1 and Embodiment 2 will be described with reference to the drawings.

Throughout the drawings, the same or corresponding components are identified by the same reference symbols and will not be described in repetition.

The following description is merely intended to recite features of the embodiment of the combination weigher. For example, when the wordings which are the same as those which identify the combination weigher or corresponding wordings are assigned by reference symbols, the corresponding specific device is an example of the components of the combination weigher.

For example, "linear feeder 12" described below as a specific example, is an example of the "feeder" which is the element of the combination weigher. Therefore, this "feeder" is not limited to the "linear feeder" but may be a supplying device of another configuration.

Therefore, the features of the embodiment of the combination weigher are in no way intended to be limited by description provided below.

[Specific Example of Combination Weigher]

Figure 1:
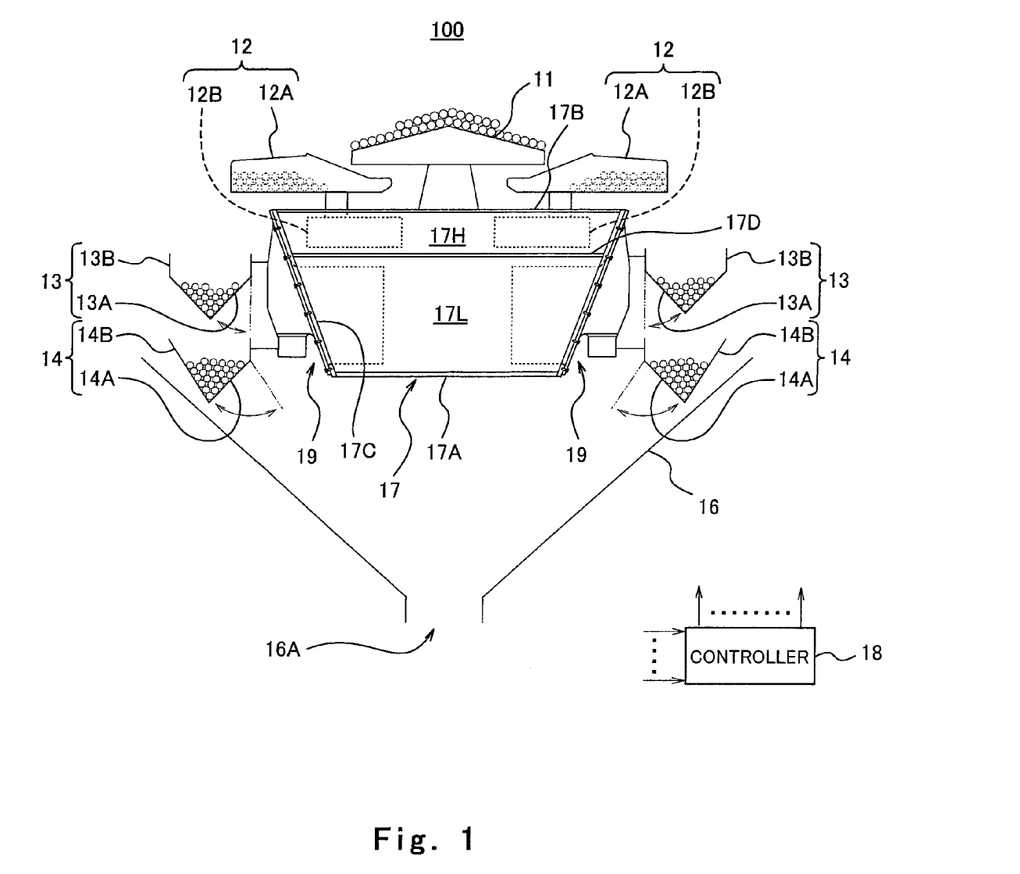
FIG. 1 is a schematic view showing an exemplary combination weigher according to an embodiment of the present invention.

FIG. 1 is a schematic view showing an exemplary combination weigher according to an embodiment of the present invention.

As shown in FIG. 1, a combination weigher 100 includes a conical dispersion feeder 11 provided at a center portion of an upper portion of the combination weigher 100 to radially disperse objects supplied from an outside supplying device (not shown), by vibration. Around the dispersion feeder 11, a plurality of linear feeders 12 are arranged in a circular shape. The objects sent from the dispersion feeder 11 are vibrated and transported on linear troughs 12A of the linear feeders 12 by vibration of vibration components 12B of the linear feeders 12, respectively, and are sent to respective feeding hoppers 13.

As shown in FIG. 1, below the linear troughs 12A of the linear feeders 12, a plurality of feeding hoppers 13 and a plurality of weighing hoppers 14 are provided so as to correspond to the linear feeders 12, respectively, and are arranged in a circular shape around the center base body 17 (body) such that they are spaced apart from each other.

Each of the feeding hoppers 13 includes a hopper body 13B and a hopper gate 13A to hold the objects sent from the linear trough 12A of the linear feeder 12, for a specified time, and discharge the objects to the weighing hopper 14 located therebelow. Each of the weighing hoppers 14 includes a hopper body 14B and a hopper gate 14A to hold the objects sent from the feeding hopper 13 located thereabove, for a specified time, and discharge the objects to a collecting chute 16.

The weighing hoppers 14 are coupled to load cells 32 (see FIG. 2) corresponding to the weighing hoppers 14, respectively. The load cells 32 output load signals (electric signals), respectively, to a controller 18.

Below the weighing hoppers 14, the collecting chute 16 of a funnel shape is disposed. The objects selected to make up a discharge combination in the combination weigher 100 are discharged from the weighing hoppers 14 and slide on and along the collecting chute 16. The objects are discharged to, for example, a packaging machine (not shown) through a discharge outlet 16A at a bottom portion thereof.

The controller 18 includes, for example, a microcontroller including a CPU and memories such as ROM and RAM which contain operation programs, operation parameters, etc., of the CPU. The CPU of the controller 18 executes the operation programs stored in the ROM, to, for example, control an operation of the overall combination weigher 100. That is, the controller 18 controls a vibration amplitude and operation time of each of the dispersion feeder 11 and the linear feeders 12. In addition, the controller 18 controls operation of actuators (stepping motors 30, 31, etc., as will be described later) for opening and closing the hopper gates 13A of the feeding hoppers 13 and the hoper gates 14A of the weighing hoppers 14.

The controller 18 serves as a weight calculating means which receives the load signals as inputs output from the load cells 32 attached with the weighing hoppers 14, and calculates weights of the objects held in the weighing hoppers 14 based on the load signals.

In addition, the controller 18 serves as a combination means which performs a combination process. In this combination process, the controller 18 performs combination calculation based on the calculated weights of the objects to find one combination of the objects in which a total of weights of the objects falls within a predetermined weight range (allowable range with respect to a target weight). If there exist plural combinations in which their total weights fall within the predetermined weight range, a combination in which an absolute value of a difference between a total of the weights of the objects and the target weight is smallest is found. And, the controller 18 determines a combination of the weighing hoppers 14 holding the objects therein corresponding to the combination found in this way as a discharge combination.

The controller 18 causes the hopper gates 14A of the weighing hoppers 14 selected to make up the discharge combination to open and close at a predetermined timing, to discharge the objects from the weighing hoppers 14. To the weighing hoppers 14 which have discharged the objects and have been emptied, the feeding hoppers 13 located thereabove feed the objects. To the feeding hoppers 13 having been emptied, the linear troughs 12A of the linear feeders 12 located thereabove feed the objects.

The controller 18 need not be constituted by a single controller, but a plurality of controllers may be dispersed and cooperate with each other to control the operation of the combination weigher. Although the example in which the weight calculating means and the combination means are constituted by the single controller 18 is described, the weight calculating means and the combination means may be constituted by separate controllers (CPUs).

As shown in FIG. 1, in the combination weigher 100, a center base body 17 corresponding to the body of the combination weigher 100 is disposed at a center portion thereof and supported by, for example, four legs (not shown).

The center base body 17 has a substantially inverted truncated pyramid shape having a polygonal side (e.g., inverted truncated pyramid shape having square sides corresponding to the number of weighing hoppers 14, etc.) and is formed by a lower wall 17A, an upper wall 17B, and a side wall 17C.

As shown in FIG. 1, the combination weigher 100 includes actuator units 19 for opening and closing the hopper gates 13A of the feeding hoppers 13 and the hopper gates 14A of the weighing hoppers 14. As shown in FIG. 1, the actuator units 19 are mounted to the side wall 17C of the center base body 17, as will be described in detail later.

The combination weigher 100 of the present embodiment has features in the structure of the actuator unit 19 and the structure of the center base body 17.

Hereinafter, features of the configuration of the combination weigher 100 of the present embodiment will be described with reference to FIG. 2.

Figure 2:
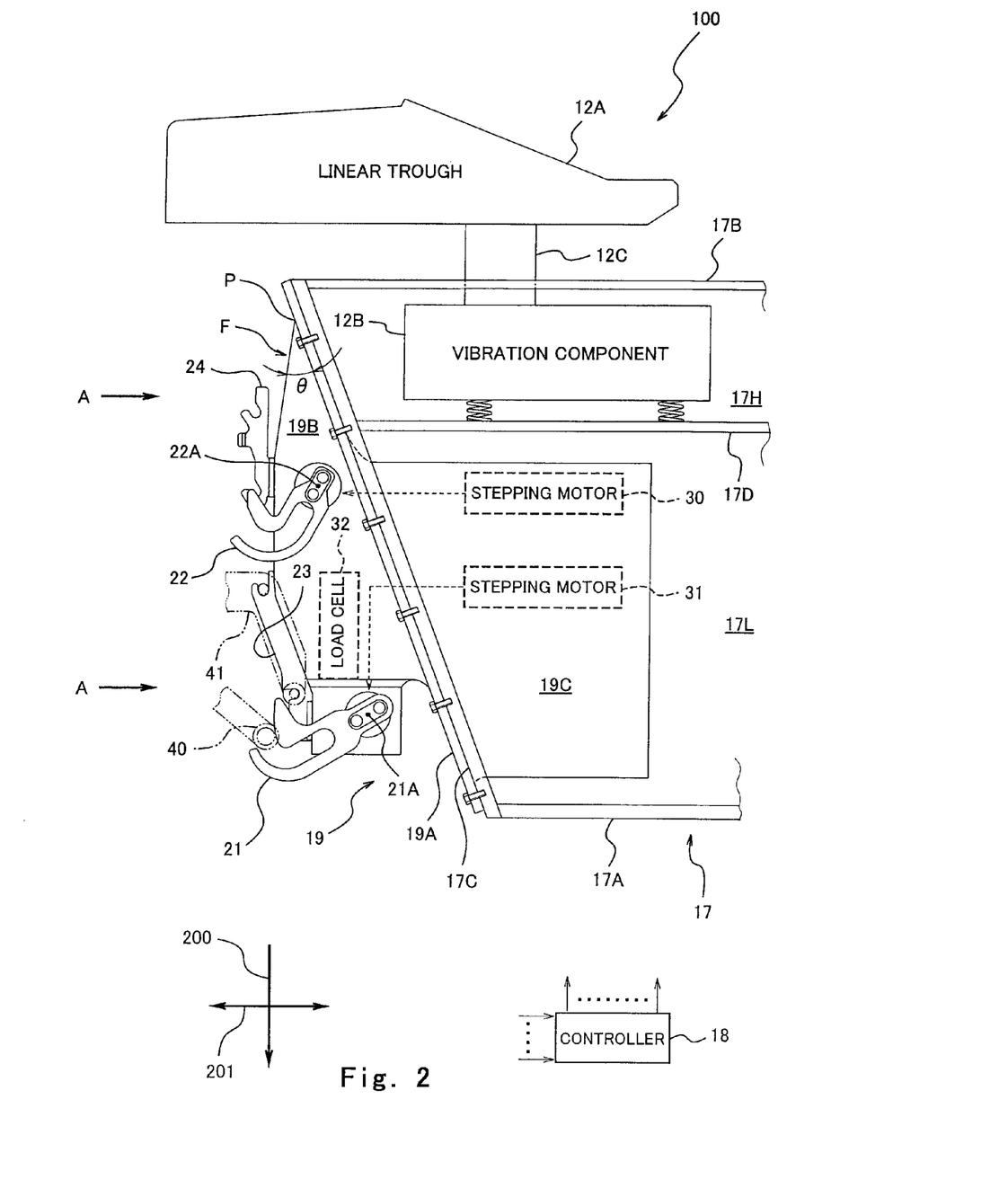
FIG. 2 is an enlarged view of a region surrounding a side wall of a center base body (body) in the combination weigher of FIG. 1.

FIG. 2 is an enlarged view of a region surrounding the side wall of the center base body (body) in the combination weigher of FIG. 1.

Initially, the structure of the center base body 17 will be described.

As shown in FIG. 2, a separating board 17D extending in a horizontal direction 201 to separate an interior of the center base body 17 is disposed inside of the center base body 17.

Thus, the center base body 17 has a lower region (hereinafter referred to as "unit accommodating room 17L") used to accommodate the actuator units 19 and an upper region (hereinafter referred to as "feeder accommodating room 17H") used to accommodate vibration components 12B of the linear feeders 12.

The feeder accommodating room 17H is formed by the plate-shaped upper wall 17B covering the interior of the center base body 17 from above, the tubular side wall 17C in which its upper opening is greater than its lower opening, and the separating board 17D.

As shown in FIG. 2, in the combination weigher 100 of the present embodiment, the vibration components 12B are surrounded by the feeder accommodating room 17H and can be disposed in a sealed state inside of the feeder accommodating room 17H. Therefore, the combination weigher 100 of the present embodiment has an excellent waterproofing property.

In this structure, for example, in a case where all of the vibration components 12B of the linear feeders 12 are required to be inspected or changed, all of the vibration components 12B of the linear feeders 12 are easily accessible by detaching the upper wall 17B serving as a lid of the feeder accommodating room 17H. Thus, maintenance of the vibration components 12B of the linear feeders 12 can be carried out easily.

In another case where a few (e.g., one or two) of the vibration component(s) 12B of the linear feeder(s) 12 is/are required to be inspected or changed, the vibration component(s) 12B of the linear feeder(s) 12 is/are accessible through, for example, an opening (not shown) provided on the side wall 17C to access the vibration components 12B of the linear feeders 12, without detaching the upper wall 17B serving as the lid of the feeder accommodating room 17H. Thus, maintenance of the vibration components 12B of the linear feeders 12 can be carried out more easily.

The vibration components 12B of the linear feeders 12 are supported on the separating board 17D via elastic members (springs, etc.). The linear troughs 12A of the linear feeders 12 are supported on the vibration components 12B via support members 12C, respectively, penetrating the upper wall 17B. This allows a vibration of the vibration components 12B to be transmitted to the linear troughs 12A, respectively. As a result, the objects are vibrated and transported on linear troughs 12A.

The unit accommodating room 17L is formed by the plate-shaped lower wall 17A covering the interior of the center base body 17 from below, the tubular side wall 17C in which its upper opening is greater than its lower opening, and separating board 17D.

Figure 3:
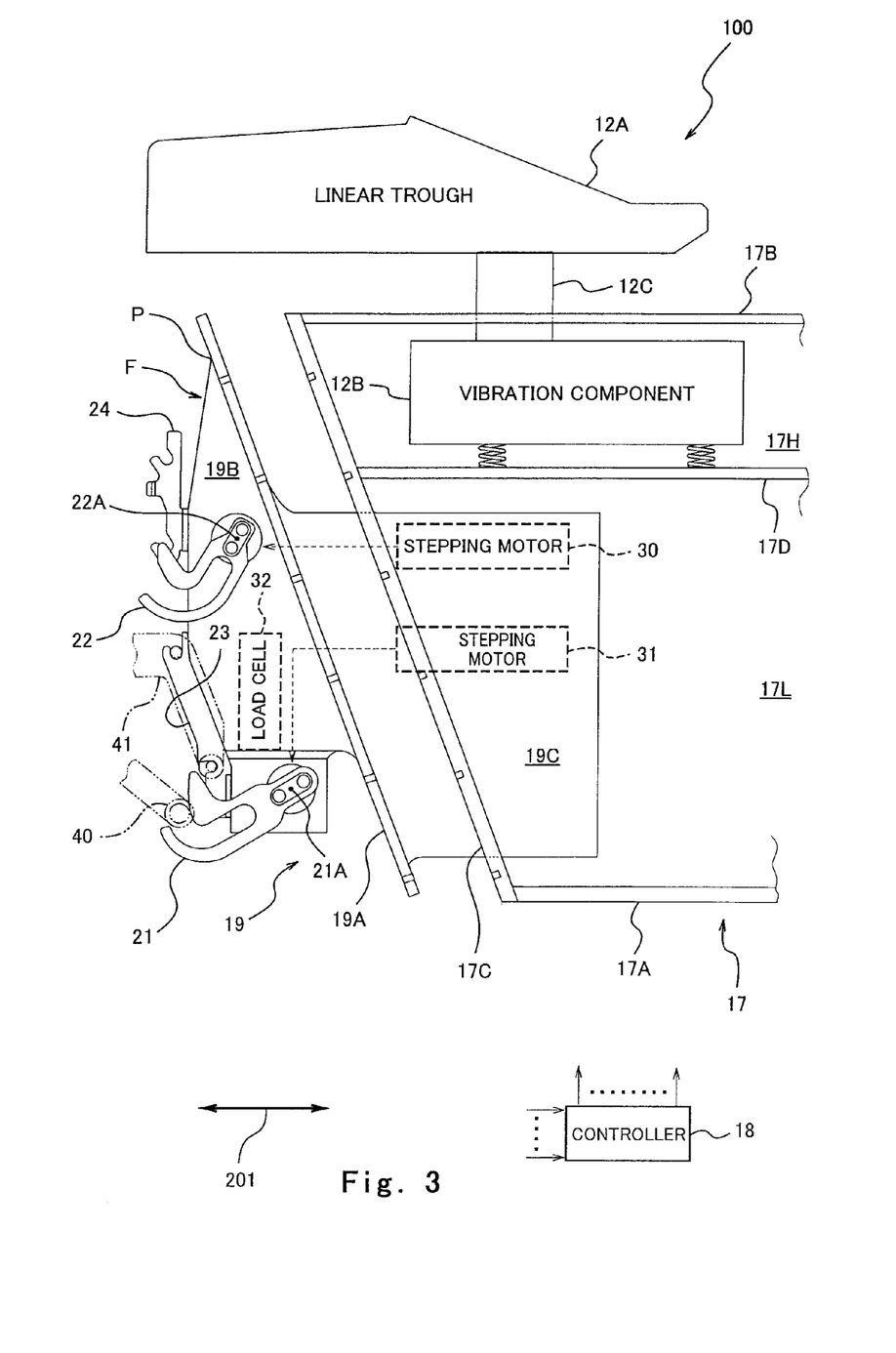
FIG. 3 is a view showing a method of attaching and detaching an actuator unit of FIG. 1.

Therefore, as shown in FIG. 2, in the combination weigher 100 of the present embodiment, the actuators (stepping motors 30, 31, etc.) inside of the actuator units 19 are surrounded by the unit accommodating room 17L and are disposed in a sealed state inside of the unit accommodating room 17L. Therefore, the combination weigher 100 of the present embodiment has an excellent waterproofing property of the actuators. In addition, portions of the actuator units 19 are integrally constructed and attached to the side wall 17C of the center base body 17. Because of this, as shown in FIG. 3, the entire actuator units 19 can be easily attached and detached to and from the center base body 17. Therefore, maintenance of the actuator units 19 can be carried out easily.

As shown in FIG. 2, in the combination weigher 100 of the present embodiment, a casing member used to accommodate the vibration components 12B of the linear feeders 12 is formed by the side wall 17C having a seamless structure which is attached with the actuator units 19. That is, the feeder accommodating room 17H and the center base body 17 attached with the actuator units 19 are formed by the side wall 17C (the feeder accommodating room 17H and the center base body 17 share the side wall 17C).

In other words, the casing member constituting a side portion of the feeder accommodating room 17H and the casing member constituting a side wall portion of the unit accommodating room 17L are formed by the single side wall 17C having a seamless structure. This allows the feeder accommodating room 17H and the unit accommodating room 17L to be formed by the side wall 17C (The feeder accommodating room 17H and the unit accommodating room 17L share the side wall 17C).

In such a structure, no gap and no stepped portion exist in the center base body 17 (specifically, between the feeder accommodating room 17H and the unit accommodating room 17L). Therefore, the combination weigher 100 of the present embodiment has great advantages that sanitary conditions are improved and cleaning is performed easily. In addition, since the components of the feeder accommodating room 17H can be reduced in number, a reduction of cost of the combination weigher 100 can be achieved.

Next, a configuration of the actuator unit 19 will be described.

As shown in FIG. 2, each actuator unit 19 has a configuration in which a weighing/opening/closing unit section 19B provided outside of the center base body 17 and a driving unit section 19C provided inside of the unit accommodating room 17L are integrally constructed as modules.

In the weighing/opening/closing unit section 19B, a hopper gate opening/closing mechanism of the weighing hopper 14, a hopper body holding mechanism of the weighing hopper 14, a hopper gate opening/closing mechanism of the feeding hopper 13, a hopper body holding mechanism of the feeding hopper 13, and a load cell 32 coupled to the weighing hopper 14, are provided.

As shown in FIG. 2, the hopper gate opening/closing mechanism of the weighing hopper 14 includes a fork-shaped cam holder 21 and a cam follower 40 (indicated by two-dotted line).

The members such as the cam follower 40 and the cam holder 21 are provided at each of both sides of the weighing/opening/closing unit section 19B and form a pair. In FIG. 2, for the sake of convenience, the members disposed at a far side in FIG. 2 of members forming pairs are not shown (the same applies to the feeding hopper as will be described later). The cam follower 40 is coupled to the hopper gate 14A (see FIG. 1) of the weighing hopper 14 by means of an actuation plate, which will not be described in detail. FIG. 2 shows an example in which the cam follower 40 is in contact with a curved surface of the cam holder 21.

Thus, in the hopper gate opening/closing mechanism, the cam follower 40 and the cam holder 21 constitute a cam mechanism.

The hopper body holding mechanism of the weighing hopper 14 includes a hanger 23 and a bracket 41 (only tip end portion is indicated by two-dotted line).

The members such as the hanger 23 and the bracket 41 are provided at each of both sides of the weighing/opening/closing unit section 19B and form a pair. In FIG. 2, for the sake of convenience, the members disposed at a far side in FIG. 2, of members forming pairs, are not shown (the same applies to the feeding hopper as will be described later).

The bracket 41 is coupled to the hopper body 14B (see FIG. 1) of the weighing hopper 14 and mounted to the hanger 23.

In the above described configuration, the cam holder 21 is rotated around a shaft 21A by a driving force from the stepping motor 31, and thereby the cam follower 40 rolls on the curved surface of the cam holder 21. Thereby, the hopper gate 14A of the weighing hopper 14 can be opened and closed in a state in which the hopper body 14B of the weighing hopper 14 is supported.

As shown in FIG. 2, the hopper gate opening/closing mechanism of the feeding hopper 13 includes a fork-shaped cam holder 22 and a cam follower (not shown). Like the hopper gate opening/closing mechanism of the weighing hopper 14, the cam follower (not shown) and the cam holder 22 constitute a cam mechanism. The hopper body holding mechanism of the feeding hopper 13 includes a hanger 24 and a bracket (not shown). Like the hopper body holding mechanism of the weighing hopper 14, the bracket is coupled to the hopper body 13B (see FIG. 1) of the feeding hopper 13 and mounted to the hanger 24.

In the above described configuration, the cam holder 22 is rotated around a shaft 22A by a driving force from the stepping motor 30, and thereby the cam follower rolls on the curved surface of the cam holder 22. Thereby, the hopper gate 13A of the feeding hopper 13 can be opened and closed in a state in which the hopper body 13B of the feeding hopper 13 is supported.

In the driving unit section 19C, the stepping motor 31, the stepping motor 30, and link mechanisms (not shown) for transmitting driving forces of the motors 30 and 31 are provided.

As shown in FIG. 2, in the actuator unit 19, a mounting section 19A of the actuator unit 19 is provided to extend along the side wall 17C between the weighing/opening/closing unit section 19B and the driving unit section 19C. By providing a suitable fastening means (e.g., screw hole, etc.) on the mounting section 19A, the actuator unit 19 is fastened to the side wall 17C so that the driving unit section 19C can be accommodated in the unit accommodating room 17L.

Specifically, in a plan view (taken in the direction of arrow along line A-A in FIG. 2) of the actuator unit 19, the side wall 17C is provided with a rectangular opening (not shown) through which the driving unit 19C can be inserted in the horizontal direction 201 into the unit accommodating room 17L. A main surface of the mounting section 19A has a flange shape (frame shape) to be in contact with a portion around the rectangular opening of the side wall 17C.

The driving unit 19C is configured not to interfere with another members when the driving unit 19C is inserted in the horizontal direction 201.

In the above configuration, as shown in FIG. 3, the entire actuator unit 19 can be easily attached and detached in the horizontal direction 201 to and from the center base body 17 (side wall 17C). Therefore, in the combination weigher 100 of the present embodiment, the actuator unit 19 can be easily detachably attached. In a side view (FIG. 2) of the actuator unit 19, an end portion of the mounting section 19A is inclined in parallel with the direction in which a cross-section of the side wall 17C of the center base body 17 extends. A front plate F (front portion of actuator unit 19) of the weighing/opening/closing unit section 19B of the actuator unit 19 is connected to the mounting section 19A outside of the center base body 17 such that an acute angle θ is formed between the front plate F and the mounting section 19A.

That is, in the side view (FIG. 2) of the actuator unit 19, the front plate F extends in a vertical direction 200 (direction of a gravitational force) from a connecting section P at which the front plate F is connected to the mounting section 19A, and extends vertically downward from the connecting section P at which the front plate F is connected to the mounting section 19A. Therefore, the actuator unit 19 can easily support the feeding hopper 13 and the weighing hopper 14 by using the front plate F.

In the above configuration, the connecting section P at which the front plate F of the weighing/opening/closing unit section 19B is connected to the mounting section 19A is linear, and therefore there is no upper surface on which wastes of the objects and dust tend to be accumulated. Therefore, the combination weigher 100 of the present embodiment has great advantages that sanitary conditions are improved and cleaning is performed easily.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

MODIFIED EXAMPLE 1

Although in the combination weigher 100 of the present embodiment, the center base body 17 has an inverted truncated pyramid shape having a polygonal side, the present invention is not limited to this.

For example, the center base body may have another shape (e.g., inverted circular truncated cone shape), so long as it has an inverted truncated shape.

MODIFIED EXAMPLE 2

Although in the combination weigher 100 of the present embodiment, the side wall 17C has a tubular shape in which its upper opening is greater than its lower opening, the present invention is not limited to this.

The side wall 17C may have a tubular shape in which its upper opening is as great as its lower opening. That is, the center base body 17 need not have an inverted truncated shape.

In the combination weigher of the present modified example, the casing member used to accommodate the vibration component of the linear feeder can be formed by the side wall attached with the actuator unit. Therefore, the advantages described in the present embodiment can be achieved.

In this case, however, the upper surface is inevitably formed in the actuator unit protruding from the center base body. In the combination weigher of the present modified example, therefore, the sanitary conditions are not so good and cleaning is not so easy as compared to those of the combination weigher 100 of the present embodiment.

MODIFIED EXAMPLE 3

Although in the combination weigher 100 of the present embodiment, the center base body 17 includes the unit accommodating room 17L used to accommodate the actuator units 19 and the feeder accommodating room 17H used to accommodate the vibration components 12B of the linear feeders 12, the present invention is not limited to this.

The center base body 17 may include at least the feeder accommodating room 17H formed by the side wall 17C. Therefore, in the present modified example, the advantages described in the present embodiment can be achieved.

INDUSTRIAL APPLICABILITY

The present invention can provide a combination weigher which can improve sanitary conditions as compared to the conventional example. Therefore, the present invention can be used in various combination weighers used to weigh objects.

REFERENCE SINGS LISTS 11 dispersion feeder
12 linear feeder
12A linear trough
12B vibration component
12C support member
13 feeding hopper
13A hopper gate of feeding hopper
13B hopper body of feeding hopper
14 weighing hopper
14A hopper gate of weighing hopper
14B hopper body of weighing hopper
16 collecting chute
16A discharge outlet
17 center base body (body)
17A lower wall
17B upper wall
17C side wall
17D separating board
17H feeder accommodating room
17D unit accommodating room
18 controller
19 actuator unit
19A mounting section
19B weighing/opening/closing unit section
19C driving unit section
21 cam holder for weighing hopper
21A shaft of cam holder for weighing hopper
22 cam holder for feeding hopper
22A shaft of cam holder for feeding hopper
23 hanger for weighing hopper
24 hanger for feeding hopper
30 stepping motor for feeding hopper
31 stepping motor for weighing hopper
32 load cell
40 cam follower for weighing hopper
41 bracket for weighing hopper
100 combination weigher
200 vertical direction
201 horizontal direction
F front plate of actuator unit
P connecting section

The invention claimed is:

1. A combination weigher which causes a plurality of feeders to feed objects to weighing hoppers corresponding to the feeders, respectively, and performs combination calculation based on weights of the objects inside of the weighing hoppers, to find a combination in which a total of the weights of the objects falls within an allowable range with respect to a target weight, the combination weigher comprising:
   actuator units for actuating the weighing hoppers; and
   a body having a side wall attached with the actuator units;
   wherein the side wall has an inverted truncated pyramid shape;
   wherein a mounting section of the actuator unit extends along the side wall;
   wherein in a plan view of the actuator unit, the side wall is provided with an opening through which a driving unit of the actuator unit can be inserted in the horizontal direction, and wherein a main surface of the mounting section of the actuator unit has a flange shape arranged to contact a portion around the opening of the side wall; and
   wherein in a side view of the actuator unit, an end portion of the mounting section of the actuator unit is inclined in parallel with the direction in which a cross-section of the side wall of the body extends, and a front portion of the actuator unit is connected to the mounting section of the actuator unit and extends vertically downward from a connecting section at which the front portion of the actuator unit is connected to the mounting section of the actuator unit outside of the body such that an acute angle is formed between the front portion of the actuator unit and the mounting section of the actuator unit.

* * * * *